United States Patent [19]
Tong et al.

[11] Patent Number: 5,859,754
[45] Date of Patent: Jan. 12, 1999

[54] MAGNETORESISTIVE TRANSDUCER HAVING A COMMON MAGNETIC BIAS USING ASSERTIVE AND COMPLEMENTARY SIGNALS

[75] Inventors: Hua-Ching Tong, San Jose; Francis H. Liu, Fremont; Minshen Tan, Fremont; Robert Earl Rottmayer, Fremont, all of Calif.; Jian-Gang Zhu, Roseville, Minn.; Samuel W. Yuan, San Carlos, Calif.

[73] Assignee: Read-Rite Corporation, Milpitas, Calif.

[21] Appl. No.: 833,058

[22] Filed: Apr. 3, 1997

[51] Int. Cl.$^6$ ........................................................ G11B 5/39
[52] U.S. Cl. ............................................................ 360/113
[58] Field of Search ............................. 360/113; 324/252, 324/207.21; 338/32 R, 32 H

[56] References Cited

U.S. PATENT DOCUMENTS

5,408,377  4/1995  Gurney et al. ........................... 360/113
5,612,098  3/1997  Tan et al. ................................. 427/529

*Primary Examiner*—George J. Letscher
*Attorney, Agent, or Firm*—Nathan N. Kallman

[57] ABSTRACT

Magnetic transducers are formed with common magnetic exchange layers capable of providing assertive and complementary signals. The transducers include an assertive transducer portion and a complementary transducer portion. Between the two transducer portions is a common bias portion which comprises an antiferromagnetic layer providing bias fields in different directions to the respective transducer portions. During normal operations, a current is directed into each of the transducer portions. The assertive transducer portion, being magnetically biased in one direction, generates a varying voltage as an assertive version of the electrical signal. The complementary transducer, being magnetically biased in another direction, generates another varying voltage as a complementary version of the electrical signal. In one embodiment, the transducer portions are implemented to operate as an anisotropic MR(AMR) sensor. In a second embodiment, the transducer portions operate as a giant MR(GMR) or spin valve sensor.

9 Claims, 6 Drawing Sheets

MAGNETORESISTIVE TRANSDUCER HAVING A COMMON MAGNETIC BIAS USING ASSERTIVE AND COMPLEMENTARY SIGNALS

CROSS-REFERENCE TO CO-PENDING PATENT APPLICATION

U.S. patent application Ser. No. 08/696,656 which issued as U.S. Pat. No. 5,612,098 for "A Method of Forming A Thin Film Magnetic Structure Having Ferromagnetic and Antiferromagnetic Layers", filed Aug. 14, 1996 on behalf of M. Tan et al. and assigned to the same assignee, discloses processes of making thin film magnetic heads having layers with different magnetization orientations. An antiferromagnetic (AFM) layer provides magnetic biasing. The subject matter of the referenced co-pending application is incorporated herein by reference.

FIELD OF THE INVENTION

This invention relates to magnetic read transducers capable of converting magnetic flux changes sensed from recorded media into assertive and complementary electrical signals.

BACKGROUND OF THE INVENTION

Inductive magnetic heads are commonly employed to perform recording and reading of data. The constant demand for high recording density disk drives with smaller physical sizes, higher storage capacities and better performance requires manufacturers to build recording components that are capable of storing data with decreased data track widths and increased linear recording densities. This poses technical problems in the design and manufacture of magnetic transducers.

Magnetoresistive (MR) heads can read information on a record medium with much narrower data track widths and yield improved signal-to-noise ratio. The output signal generated during the data reading process is independent of the traveling speed of the recording medium. A typical MR head includes an MR sensor sandwiched between two magnetic shield layers. Disposed between the MR sensor and the magnetic shield layers are insulating layers. During the data reading mode, the magnetic shields act as magnetic flux guides confining the magnetic flux emanating from a record medium, and allow selected flux to be snsed by the MR sensor. Changes in magnetic flux correspondingly vary the resistivity of the MR sensor. A direct electric current passing through the MR sensor in turn generates a varying voltage which representss the information stored by the record medium.

In practice, miniaturized MR read heads experience various practical problems. For example, the MR layer in the magnetic head needs to be properly biased. The ferromagnetic MR layer at its natural state comprises a multiple number of magnetic domains separated by domain walls. These domain walls are highly unstable. During normal operation, the constant merging and splitting of the domain walls generate undesirable signal noise, commonly called Barkhausen noise, which degrades the performance of the magnetic head. To suppress the signal noise, hard magnetic bias layers are normally attached to the ferromagnetic layer for the purpose of aligning the magnetic domains in a single domain configuration. Furthermore, to position the ferromagnetic layer in the linear operating region, another bias, called the transverse bias needs to be provided to the ferromagnetic layer. A soft adjacent layer formed of a material with relatively high resistivity and minimal MR response is disposed adjacent to and spaced from the ferromagnetic layer to provide the transverse bias.

For the above reasons, there is a need to provide magnetic transducers that can interact with storage media having narrow data tracks with high linear recording densities, yet sufficiently sensitive to sense only the data signals being read from the recorded magnetic medium without the undesirable signal noise.

SUMMARY OF THE INVENTION

It is an object of the invention to provide magnetic transducers miniaturized in size and capable of interacting with storage media having narrow data track widths and high linear recording densities.

It is another object of the invention to provide magnetic read transducers with high sensitivity for signal sensing yet capable of screening out undesirable signal noise.

It is yet another object of the invention to provide magnetic read transducers with simplicity in design and reduction in processing steps, thereby reducing manufacturing costs.

According to the present invention, a magnetic transducer includes an assertive transducer portion and a complementary transducer portion. Between the two transducer portions is a bias portion which comprises an antiferromagnetic layer providing different bias fields to the two transducer portions. In the first embodiment, the transducer portions are implemented and operated in the anisotropic MR (AMR) mode. In the second embodiment, the transducer portions operate as a giant MR (GMR) or spin valve sensor.

In the first embodiment, the bias portion includes an antiferromagnetic layer. Each of the assertive and complementary transducer portions includes first and second layers of ferromagnetic material, respectively. The antiferromagnetic layer is deposited between and in contact with the first and second ferromagnetic layers. Different directions of uniaxial antisotropy are induced in the first and second ferromagnetic layers during fabrication. The different directions of magnetization in the first and second layers are sustained by the interposed antiferromagnetic layer through the mechanism of exchange coupling. Each of the first and second layers of ferromagnetic material, being biased differently by the bias layer in different directions, varies in resistivity differently in response to changes in magnetic flux intercepted by the transducer. When bias currents are applied, the first and second layers correspondingly generate varying voltages as assertive and complementary versions of the electrical signal, respectively.

In the second embodiment, the bias portion includes an antiferromagnetic layer. The assertive transducer portion includes first and third layers of ferromagnetic material. The first layer is designated as the pinned layer and the third layer as the active layer. The first and third layers are spaced from each other through a nonmagnetic layer. The complementary transducer portion includes second and fourth layers of ferromagnetic material. The second layer is designated as the pinned layer and the fourth layer as the active layer. The second and fourth layers are also spaced from each other through another nonmagnetic layer. The layer of antiferromagnetic material, being disposed in contact with the first and second layers, biases the first and second pinned layers to different directions. However, the third and fourth active layers, having initial directions of uniaxial anisotropy angularly oriented differently with respect to the magnetization of the first and second pinned layers, respectively, varies in resistivity differently in response to changes in magnetic flux intercepted by the transducer. When bias currents are applied, the third and fourth layers correspondingly generate varying voltages as assertive and complementary versions of the electrical signal, respectively.

Transducers made in accordance with this invention are capable of generating assertive and complementary signals with common mode noise rejection, which provides noise screening. The assertive and complementary signal versions, superimposed on each other, essentially double the amplitude of the sensed signal. In effect, the output electrical signal generated from the transducers of this invention is nearly doubled in amplitude and is practically free of noise. Furthermore, there is only one layer, the antiferromagnetic layer, performing the various functions of a magnetic biasing layer and insulator for the assertive and complementary sensor. This unique feature enables the read transducer to be built with reduced total thickness through simplified processing steps. Transducers of the present invention operate successfully with narrow data track widths and high recording densities.

These and other features and advantages of the invention will be apparent to those skilled in the art from the following detailed description, taken together with the accompanying drawings, in which like reference numerals refer to like parts.

DETAILED DESCRIPTION OF THE INVENTION

Figure 1:
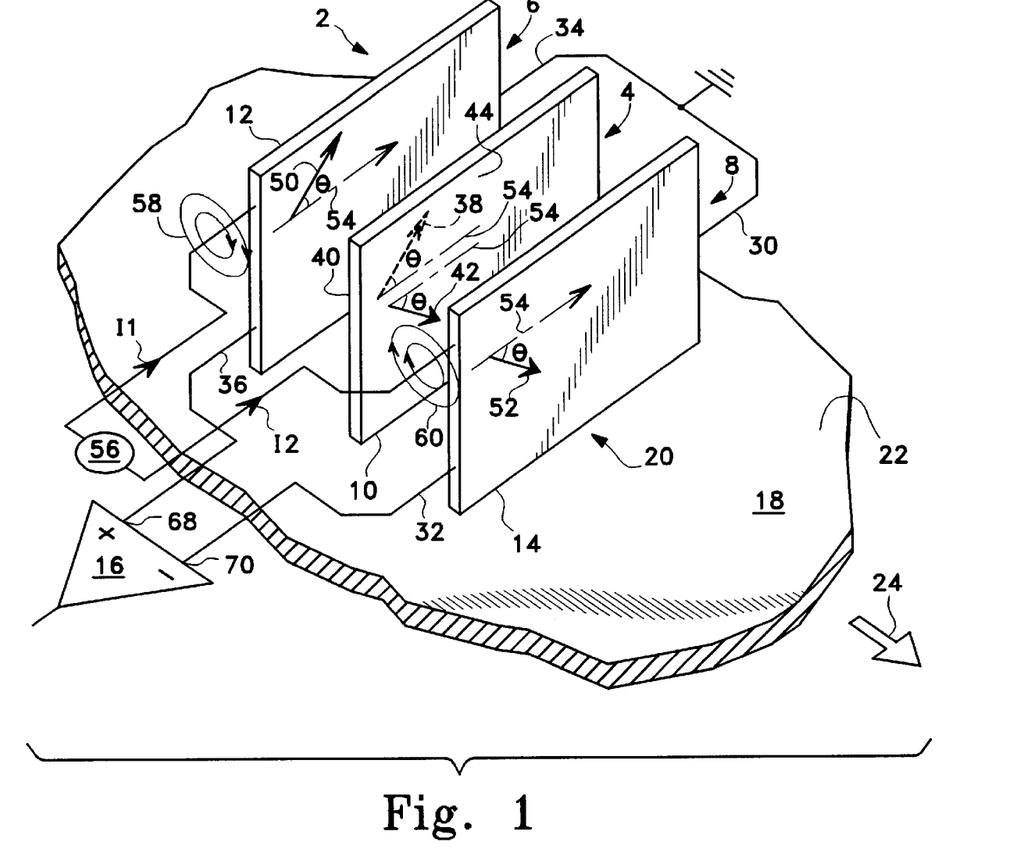
FIG. 1 is an exploded view schematically showing the relative positions of magnetization vectors in the various layers of an anisotropic MR transducer.

FIG. 1 shows a transducer 2 comprising a bias portion 4 disposed between an assertive transducer portion 6 and a complementary transducer portion 8. In this embodiment, the bias portion 4 includes a bias layer 10 which is electrically insulating and is formed of an antiferromagnetic material. An example of such a material is an oxide of nickel and cobalt alloy ($NiCo-O_x$). Alternatively, other nonconducting antiferromagnetic materials can be used as substitutes, such as ferric oxide ($Fe_2O_3$) and neodymium ferrous oxide ($NdFeO_3$).

The assertive and complementary transducer portions 6 and 8 comprise first and second ferromagnetic layers 12 and 14, respectively. Layers 12 and 14 are preferably made of a soft magnetic material which is high in permeability and low in coercive force. In this embodiment, the ferromagnetic layers 12 and 14 are formed of Permalloy, a nickel-iron alloy (NiFe). For each of the ferromagnetic layers 12 and 14, one end is tied to ground potential and the other end is connected to an input of a differential amplifier 16.

During normal operations, the transducer 2 flies above a storage medium 18 separated by an air gap 20. The storage medium 18 can be a tape or disk coated with a magnetic material which provides magnetic storage. The medium 18 is magnetized with a magnetic flux pattern which corresponds to stored information or data. During the data reading mode, the medium 18 moves in a direction of the arrow 24, for example. The flux of magnetic transition on the record medium 18 is sensed by the transducer 2 as changes in magnetic flux which in turn dynamically alter the resistivity of the ferromagnetic layers 12 and 14. Changes in resistivity of layers 12 and 14 correspond to the information read out from the medium 18. The resistivity changes are converted into electrical signals.

Figure 2:
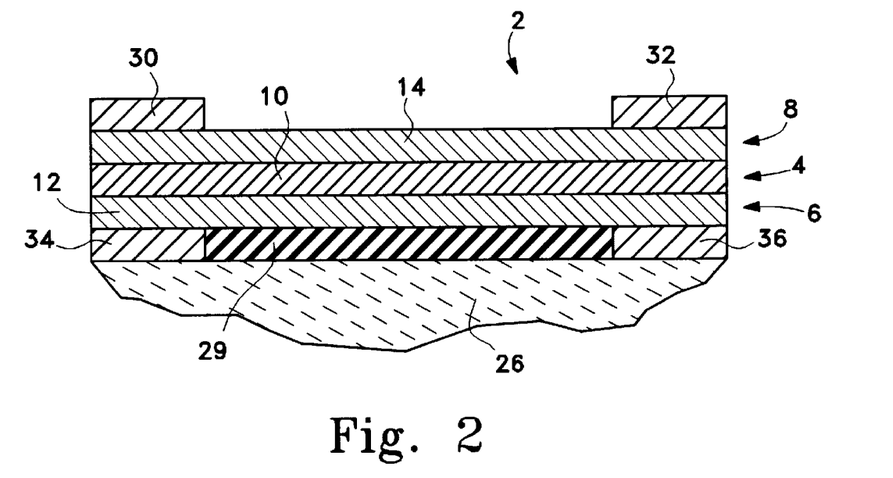
FIG. 2 is a cross-sectional view schematically illustrating a thin film implementation of the anisotropic MR transducer as shown in FIG. 1.

FIG. 2 is a cross-sectional view showing a thin film implementation of the transducer 2. The transducer 2 is preferably fabricated on a ceramic substrate 26 which is nonmagnetic and nonconducting. Above the substrate 26 is the first ferromagnetic layer 12 spaced by an insulator layer 29. The bias layer 10 is sandwiched between the first ferromagnetic layer 12 and the second ferromagnetic layer 14. There are two conducting leads, namely, electrical leads 34 and 36, disposed in contact with each end of the first ferromagnetic layer 12. Similarly, there is another pair of electrical leads 30 and 32 formed of conducting material disposed in contact with each end of the second ferromagnetic layer 14. Electrical leads 32 and 36 are electrically connected to the inputs 70 and 68, respectively, of the differential amplifier 16 (FIG. 1). Electrical leads 30 and 34 are shorted to ground potential in this embodiment.

The process of fabricating the transducer 2 is disclosed in the referenced co-pending application Ser. No. 08/696,656. In this embodiment, each of the layers 10, 12, and 14 is deposited to a thickness of approximately 250 Å, 50 Å, and 50 Å, respectively.

As is known in the art, in the absence of any external forces, the directions of magnetic moments of adjacent ions in an antiferromagnetic material are anti-parallel to each other. However, through the process of exchange coupling as disclosed in the referenced copending application, the direction of magnetization on the surface of a layer of antiferromagnetic material can be conditionally sustained, resulting in a directional magnetization in the adjacent ferromagnetic material. Normally, when a piece of ferromagnetic material is magnetized, the magnetic moments of the adjacent ions in any magnetic domain of the material are aligned in a single direction. The gross magnetization of the ferromagnetic material is determined by magnetization of the dominant domains. With antiferromagnetic material, since the magnetic moments of the adjacent ions are anti-parallel to each other, the gross magnetization of a piece of antiferromagnetic material is always zero. However, when the surface of a ferromagnetic material having uniaxial anisotropy is brought into intimate contact with the surface of an antiferromagnetic material, portions of the ions with the same magnetic moments in the antiferromagnetic material are attracted to the material boundary, thereby sustaining a surface magnetization on the material interface. The surface magnetization is the outcome of a specific accumulation arrangement of the magnetic moments. Withdrawal of the ferromagnetic material with the uniaxial anisotropy will result in rearrangement of the,ions and the loss of the surface magnetization. Accordingly, in the specification and in the appended claims, the term "magnetization" or its equivalents, when used to describe antiferromagnetic material, connotes the above meaning.

With reference to FIGS. 1 and 2, the first ferromagnetic layer 12 of the transducer 2 is first laid above the substrate 26 with an initial direction of uniaxial antisotropy 50. The first ferromagnetic layer 12, being in intimate contact with the first surface 40 of the antiferromagnetic layer 10, exchange-couples and orients the surface magnetization of layer 10 at the surface 40 to a direction of magnetization 38. In a similar manner, the second ferromagnetic layer 14, being in intimate contact with second surface 44 of the antiferromagnetic layer 10, orients the surface magnetization of layer 10 at the surface 44 to a direction of magnetization 42 also by the process of exchange coupling. The surface magnetization vectors 38 and 42 can coexist and are oriented angularly relative to each other within the layer 10 due to the inherent characteristic of the antiferromagnetic material of the layer 10 as mentioned above. The surface magnetizations 38 and 42 reinforce the directions of uniaxial antisotropy 50 and 52 in layers 12 and 14, respectively. The reinforcement process is iterative. Absent any external influences, this configuration is the lowest maintainable energy state. The magnetization vectors 38 and 42 provide the necessary magnetic biases to the first and second ferromagnetic layers 12 and 14, respectively. For the purpose of illustration as shown in FIG. 1, the directions of surface magnetization 38 and 42 position themselves at 2θ with respect to each other.

However, the finally settled state of magnetization may be influenced by other magnetic fields. A bias current source 56 injects currents I1 and I2 into the first and second ferromagnetic layers 12 and 14, respectively. Currents I1 and I2, flowing in the direction along the longitudinal axis 54, generate magnetic fields 58 and 60, respectively, in accordance with Ampere's law. Magnetic fields 58 and 60 can alter the angle θ by rotating the directions of uniaxial anistrophy 52 and 50, respectively in opposite directions. In selecting the optimal angle θ as the quiescent operating point, fields 58 and 60 generated by the respective currents I2 and I1 need to be taken into consideration.

Figure 3:
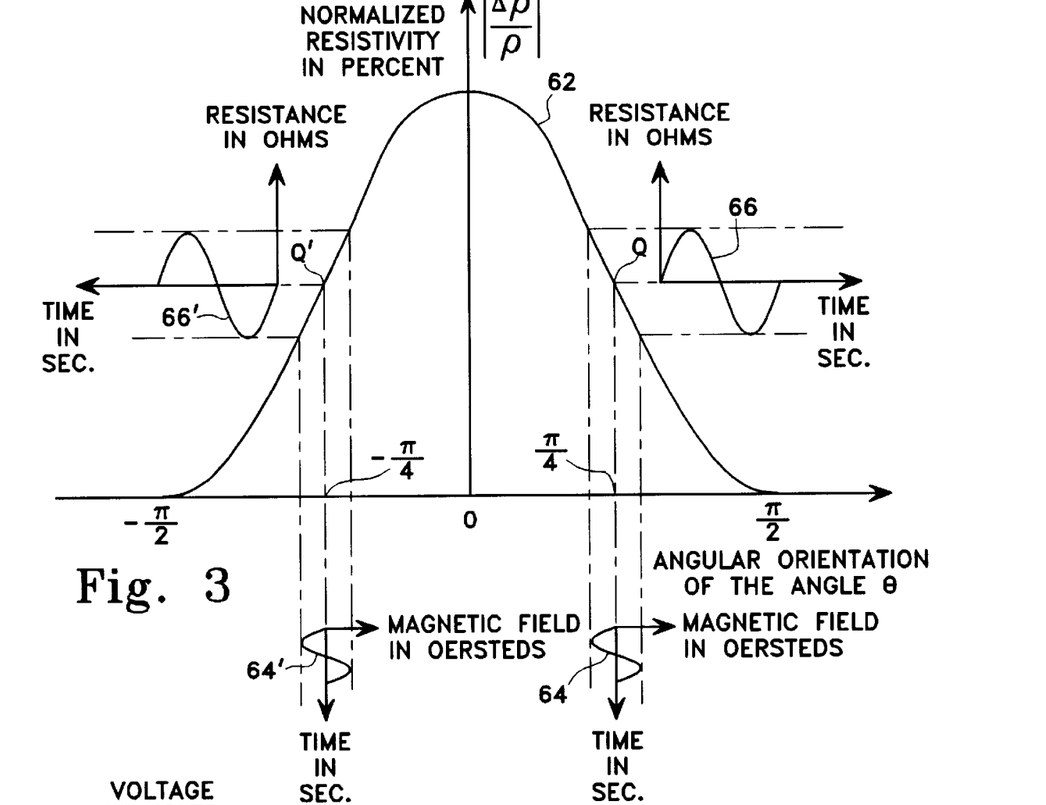
FIG. 3 is a graphical representation of the normalized resistivity of the active layer in each transducer portion of the anisotropic MR transducer as shown in FIG. 1.

The optimal value at the quiescent state for the angle θ is in the neighborhood of 45°, which would position both the first and second ferromagnetic layers 12 and 14 to linear operating regions. FIG. 3 is a graphical representation of the normalized resistivity of either the ferromagnetic layer 12 or 14 as a function of angular orientation of the angle θ. If at proper bias current, the direction of uniaxial anisotropy 50 is optimally oriented by positioning itself at an angle θ of 45° with respect to the longitudinal axis 54, the layer 12 will operate at a quiescent operating point Q, which is well within the linear region of the magnetoresistivity curve 62 as shown in FIG. 3. In a similar manner, when the direction of uniaxial anistropy 52 is at an angular value of −45° with respect to the longitudinal direction 54, the operating point of the second ferromagnetic layer 12 is placed at the quiescent point −Q in the magnetoresistivity curve 62 shown in FIG. 3.

As is known in the art, resistivity of a ferromagnetic material varies as the square of the cosine of the angle between the direction of magnetization and the direction of current flow. If the storage medium 18 moves in the direction 24 as shown in FIG. 1, then the magnetic flux magnetized on the disk surface passes the transducer 2 which in turn experiences changes in magnetic flux. With reference to the assertive transducer portion 2 if the magnetic flux change is sinusoidal, as shown in FIG. 3 and by reference numeral 64, the first MR layer 12 will change in resistivity along the resistivity curve 62. In essence, the angle θ varies due to the magnetic flux change represented by the curve 64. The quiescent point Q is located in the neighborhood of a linear region. The resistance of the first MR layer 12 also changes sinusoidally, as represented by the curve 66. As mentioned before, the bias current I2 is constant, and the voltage to the assertive input 68 of the differential amplifier 16 changes sinusoidally as shown by the curve 72 in FIG. 4, in conformance with Ohm's law. Similar characteristics apply to the complementary transducer portion 8. That is, the magnetic flux change 64' triggers the resistance change 66' in the second ferromagnetic layer 14, which in turn generates a voltage curve 72' with opposite polarity as shown in FIG. 4 at the complementary input 70.

Figure 4:
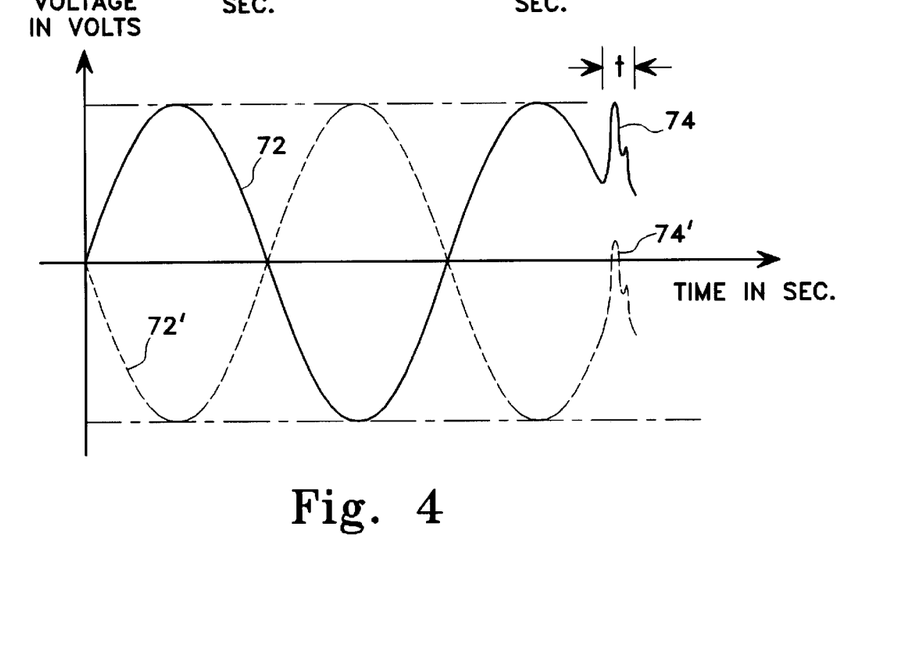
FIG. 4 is waveform diagram displaying the electrical signal in assertive and complementary versions generated from the anisotropic MR transducer as shown in FIG. 1.

In FIG. 4, the assertive and complementary voltage curves 72 and 72' are superimposed together in the time domain. The amplifier 16 accepts differential signals, as shown in FIG. 4, and the voltage difference fed to the assertive and complementary inputs 68 and 70, respectively, are practically doubled. This mode of signal transmission is more immune to noise, such as popcorn noise commonly associated with a magnetic transducer. The reason is when such noise occurs, it impinges on both the assertive and complementary portions 6 and 8 simultaneously. For example, as shown in FIG. 4, noise spikes 74 and 74' respectively impinge on the assertive transducer portion 6 and complementary transducer portion 8. During the time of the noise occurrence t, the differential voltage received by the amplifier 16 remains the same as if the noise event were not existent. With this feature, the transducer 2 is highly sensitive to weak signals but capable of screening out undesirable noise. Transducers thus built can interact with storage media having narrow data tracks which emanate weaker magnetic flux, and in noisy environments.

Figure 5:
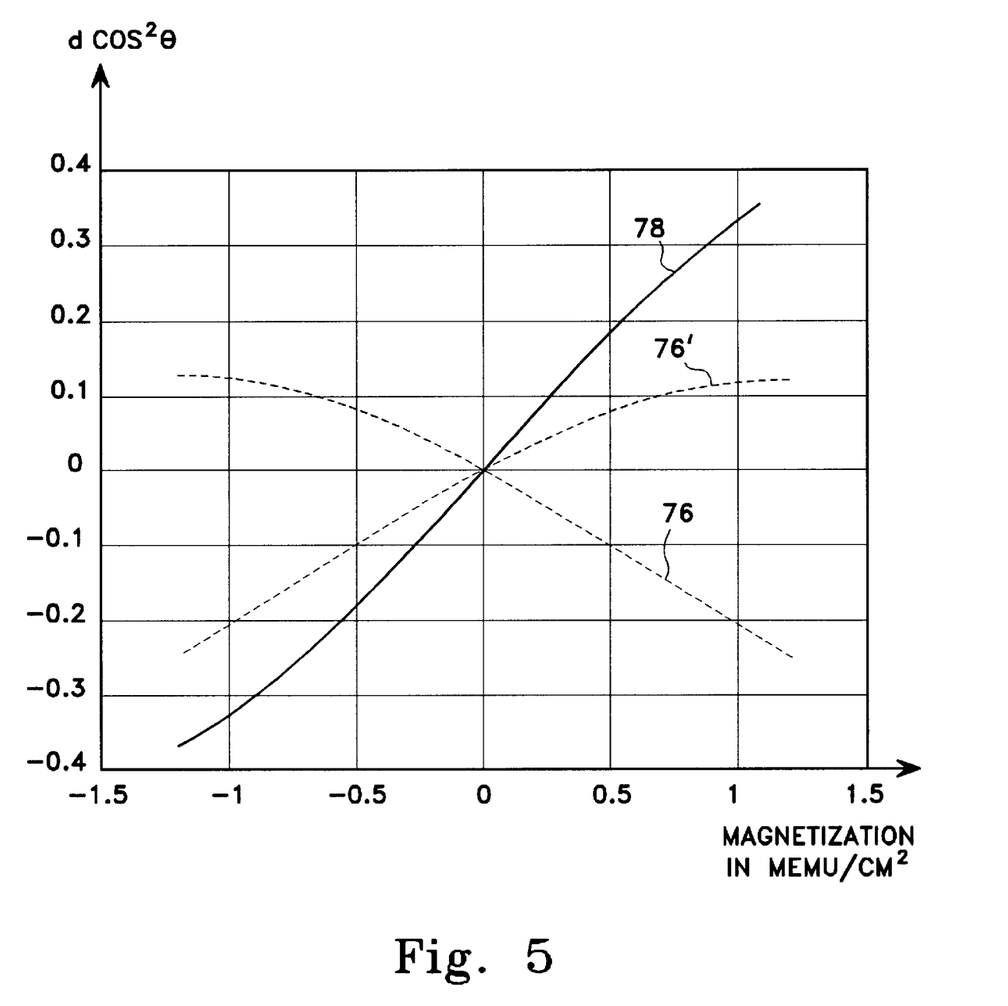
FIG. 5 is a graphical representation showing the substantially linear relationship between direction of the output signal and the flux intercepted by the transducer shown in FIG. 1.

In addition, output signals generated by the transducer 2 are relatively symmetrical, due to the inherent symmetrical design of the transducer 2. The magnetic bias originates directly from the center bias layer 10. The two MR layers 12 and 14 have no direct influence on each other. As a consequence, the output signals are substantially symmetrical. Shown in FIG. 5 are the combined output of the two portions 6 and 8 represented by the curve 78. The y-axis is the square of the cosine of the magnetization angle θ, and the x-axis is the flux emanating from the storage medium measured in milli-electromagnetic units (MEMU), such as Oersteds per square centimeter, for example. The curve 76 is the response of the assertive portion operating alone with the complementary portion 8. Similarly, the curve 76' is the response of the complementary portion operating alone with the assertive portion 6. The symmetrical result of the combined output 78 is clearly evident from FIG. 5 in comparison with the other outputs.

In most prior art MR transducers, longitudinal bias and transverse magnetic bias are separately and independently provided for the active read layer. The longitudinal bias is used to align the active read layer into a single domain state to eliminate Barkhausen noise and the transverse bias is used to orient the active read layer into the active linear region. In contrast, in the transducer 2 of the invention, not only does the bias layer 10 provide both the longitudinal and transverse magnetic biases to the assertive read layer 12, but it also supplies the same types of biases to the complementary bias layer 14. As a consequence, transducer 2 is much less complex in structure and more economical to fabricate.

The above described transducer is called an anisotropic MR (AMR) transducer. There is another class of transducer, called the giant MR (GMR) transducer which is based on a different structural arrangement and operational principles, as illustrated by the embodiment described below.

Figure 6:
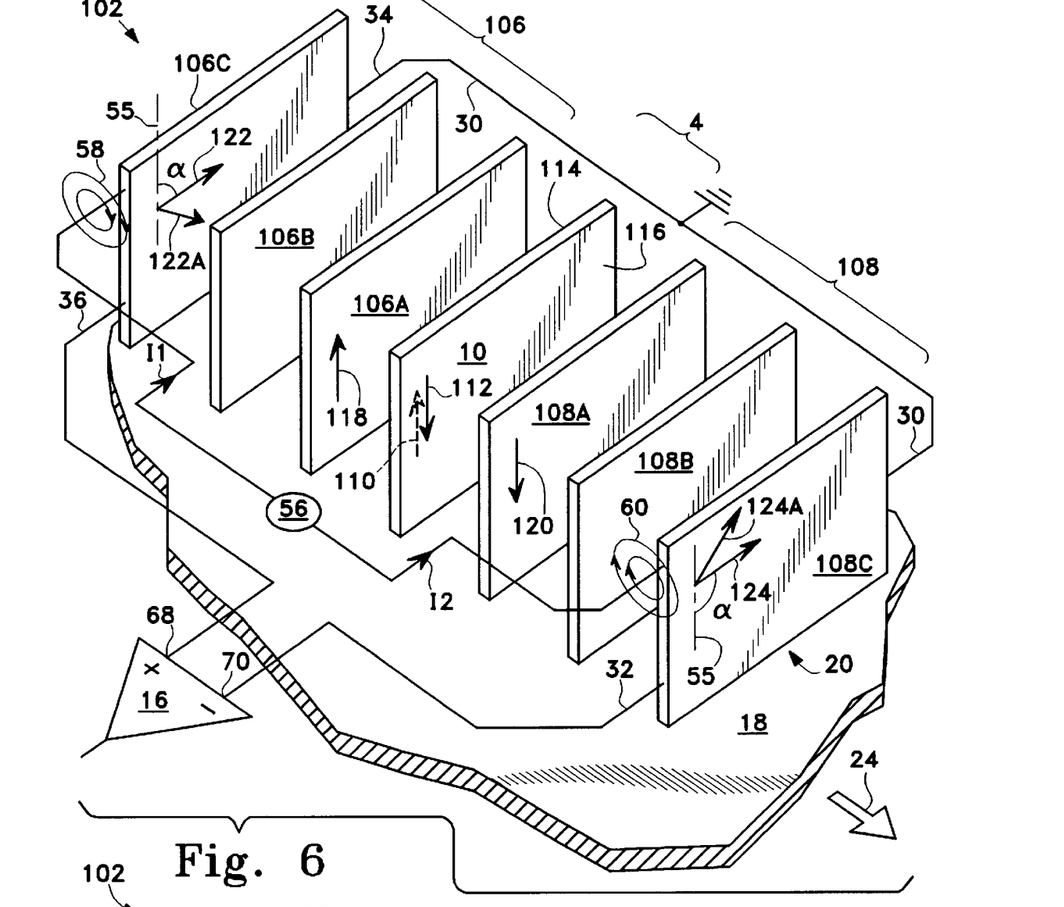
FIG. 6 is an exploded view schematically showing the relative positions of magnetization vectors in the various layers of a giant MR transducer.

FIG. 6 shows schematically the second embodiment of the invention of a transducer 102, which comprises an exchange pinning layer portion 4 disposed between two spin valve portions 106 and 108. As with the previous embodiment, the exchange pinning portion 4 includes a bias layer 10 formed of a material which is electrically insulating and antiferromagnetic. Suitable materials for the bias layer 10 include nickel cobalt alloy oxide (NiCo-$O_x$), ferric oxide ($Fe_2O_3$) or nickel oxide (NiO).

The spin valve 106 comprises a pinned layer 106A, a spacer layer 106B and a free layer 106C. The spacer layer 106B is disposed between the pinned layer 106A and the free layer 106C. The pinned layer 106A and the free layer 106C are preferably made of softer ferromagnetic materials having a high permeability and a low coercive force. The spacer layer 106B is formed of a nonmagnetic and conducting material such as copper (Cu), gold (Au) or silver (Ag).

It should be noted that the thickness of the spacer layers 106B and 108B is significant in the design of the transducer 102. For example, for the assertive transducer portion 106, the thickness of the spacer layer 106B should be thick enough to minimize the exchange coupling between the pinned layer 106A and the active layer 106C, and yet thin enough to enhance spin valve effect. That is, the thickness of the spacer layer 106B needs to be smaller than the mean free path of the conduction electrons from the pinned layer 106A to pass into the active layer 106C. By the same line of reasoning, the same restrictions apply to the thickness of the spacer layer 108B in the complementary transducer portion 108.

In a similar manner, the complementary transducer portion 108 includes a spacer layer 108B disposed between a pinned layer 108A and active layer 108C. The complementary transducer portion 108 is a mirror image of the assertive transducer portion 106 about the exchange coupling portion 4 in this embodiment. For the sake of conciseness, a detailed structural description of the complementary transducer portion 108 is not provided.

The magnetoresistivity of the transducer 102 is highly sensitive to external magnetic flux changes. It has been found that the magnetoresistivity varies as a function of the cosine of the angle between the directions of magnetization of the pinned layer and the active layer. In this embodiment, the transducer 102 is operated under the GMR effect, or alternatively the spin valve effect.

Figure 7:
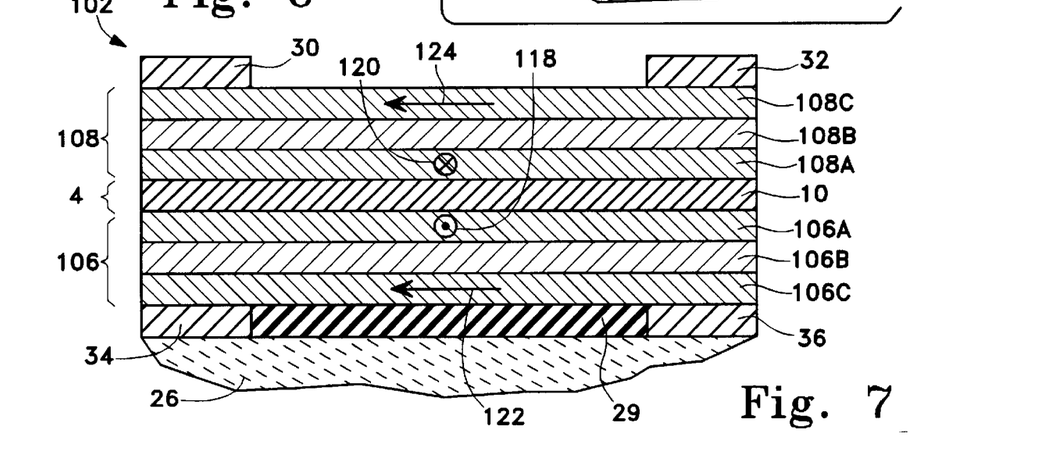
FIG. 7 is a cross-sectional view schematically illustrating a thin film implementation of the giant MR transducer as shown in FIG. 6.

FIG. 7 is a sketch of a cross-sectional view showing a thin film implementation of the transducer 102. As with the previous embodiment, the transducer 102 is preferably fabricated on a nonmagnetic and nonconducting substrate 26, such as ceramic. Above the substrate 26 and spaced from an insulating layer 29 is the assertive transducer portion 106 which includes the active layer 106C, the spacer layer 106B and the pinned layer 106A. The exchange coupling layer 10 is laid above the pinned layer 106A. The complementary transducer portion 108 is built on the top of the bias layer 10. The complementary portion 108 includes the active layer 108C, the spacer layer 108B and the pinned layer 108A. There are two conducting leads, namely, electrical lead 30 and 32, disposed in contact with each end of the active layer 108C. Similarly, there is another pair of electrical leads 34 and 36 formed of conducting material disposed in contact with each end of the other active layer 106C. Electrical leads 32 and 36 are electrically connected to the differential amplifier 16 (FIG. 6). Electrical leads 30 and 34 are grounded in this embodiment.

The process of fabrication for the transducer 102 is disclosed in the aforementioned referenced copending application. In this embodiment, the thickness of the layers 108C, 108B, 108A, 10, 106A, 106B, and 106C are respectively 20–100 Å, 10–50 Å, 10–100 Å, 50–500Å, 10–100 Å, 10–50 Å, and 20–100 Å.

FIG. 6 shows the directions of magnetization between the various layers. The pinned layers 106A and 108A are fabricated with initial directions of uniaxial anistropy 118 and 120, respectively. However, pinned layers 106A and 108A are in intimate contact with the surfaces 114 and 116, respectively, of the bias layer 10. As explained before, surface magnetizations 110 and 112 are sustained on each of the major surfaces 114 and 116, respectively, of the bias layer 10. In return, in the layer 106A, a direction of magnetization 118 is pinned parallel to the vector 110 in the layer 10 through the process of exchange coupling. Similarly, in the layer 108A, another direction of magnetization 120 is pinned parallel to the vector 112 in the layer 10. As mentioned before, the pinned layers 106A and 108A are made of ferromagnetic materials with a relatively high coercive force to withstand external field changes without much perturbation.

The following description is directed to the pinned portion 106. Operation of the complementary transducer portion 108 is substantially similar with minor modifications. The free layer 106C is disposed parallel to and spaced from the pinned layer 106A through the spacer layer 106B. The free layer 106C is initially fabricated with a direction of uniaxial anisotropy, signified by the reference numeral 122A, perpendicular with respect to the traversing axis 55.

Figure 8:
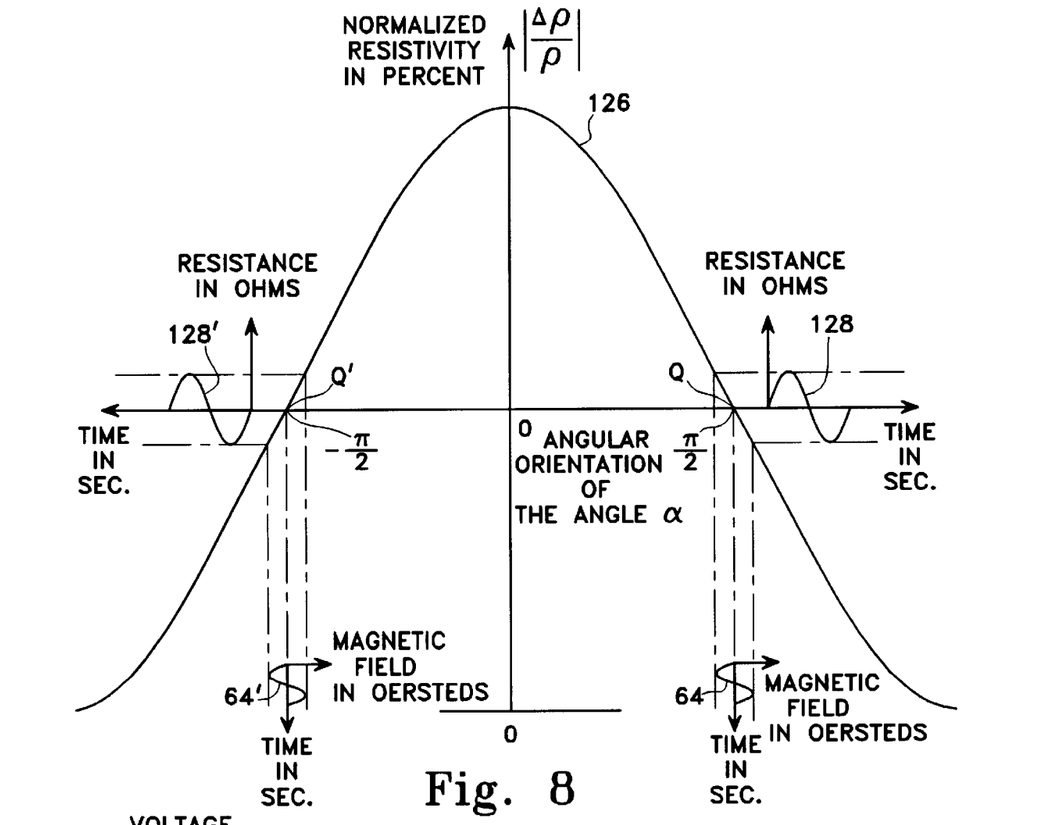
FIG. 8 is a graphical representation of the normalized resistivity of the active layer in each transducer portion of the giant MR transducer as shown in FIG. 6.

As previously mentioned, the resistivity of the spin valve layers 106 and 108 varies as the cosine of the angle α and −α between the directions of magnetization of the pinned layers 106A and 106B and free layers 106C and 108C respectively. When the transducer 102 is positioned above the storage medium 18, magnetic flux changes emanating from the medium 18 rotates the magnetization directions 122 and 124 and accordingly, the angle α varies. FIG. 8 is a graphical representation of the normalized resistivity of either the active layers 106C or 108C as a function of the angular orientation of the angle α.

If the direction of magnetization 122 is optimally oriented by positioning itself at 90° with respect to the traversing axis 55, then the active layer 106C operates at a quiescent operating point Q, which is well within the linear region of the magnetoresistivity curve 126 as shown in FIG. 8. In a similar manner, in the complementary transducer circuit portion 108, when the direction of magnetization 124 is at an angular value of −90° with respect to the traversing axis 55, the operating point of the active layer 108C is placed at the quiescent point –Q in the magnetoresistivity curve 126 shown in FIG. 8.

If the storage medium 18 moves in the direction 24 as shown in FIG. 6, then the magnetic flux magnetized on the disk surface passes the transducer 102 which in turn experiences changes in magnetic flux. If the magnetic flux change is sinusoidal, as shown in FIG. 8 by the graphical representation signified by the reference numeral 64, then in response, the spin valve 106 changes in resistivity along magnetoresistivity curve 126. In essence, the angle a varies due to the magnetic flux change represented by the curve 126. Since the quiescent point Q is located in the neighborhood of a linear region, the resistance of the spin valve 106 also changes sinusoidally, as represented by the curve 128. As mentioned before, the current I1 is constant, the voltage to the input 68 of the differential amplifier 16 also changes sinusoidally as shown by the curve 132 in FIG. 5, in accordance with Ohm's law. A similar scenario applies to the complementary transducer portion 108. That is, the magnetic flux change 64' triggers the resistance change 128' in the spin valve 108, which in turn generates a voltage 132' as shown in FIG. 9 at the complementary input 70 of the amplifier 16.

Figure 9:
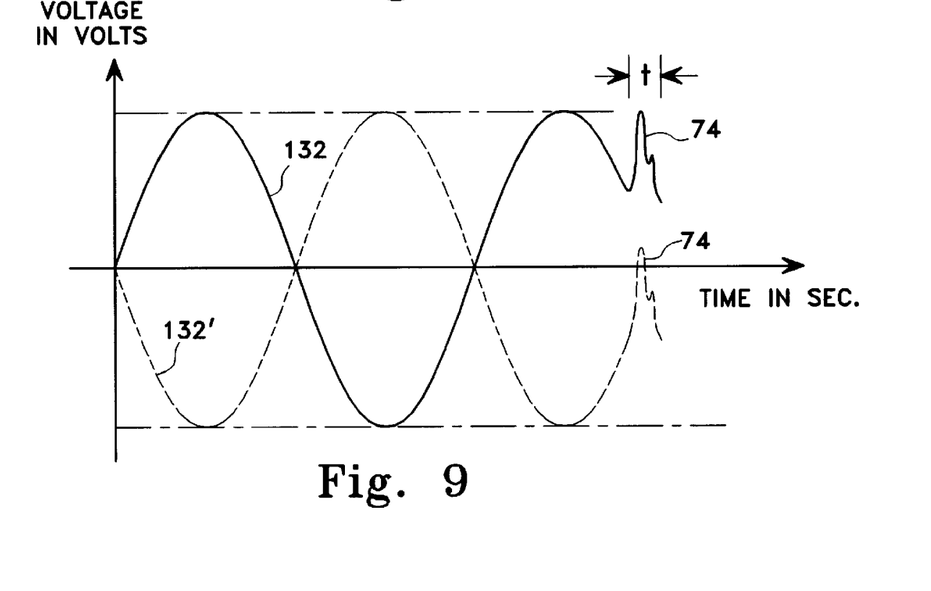
FIG. 9 is waveform diagram displaying the electrical signal in assertive and complementary versions generated from the giant MR transducer as shown in FIG. 6.

In FIG. 9, the voltage curves 132 and 132' are superimposed together in the same time domain. The amplifier 16 accepts differential signals as can be seen in FIG. 9, and the voltage difference fed to the inputs 68 and 70, respectively, are practically doubled. As explained before, this mode of signal transmission is more immune to noise, such as popcorn noise commonly associated with a magnetic transducer. A noise spike 74 on the transducer 102 is equally received by the spin valve 106 and the spin valve 108. During the time of the noise occurrence t, the differential voltage received by the amplifier 16 remains the same as if the noise event were nonexistent. The transducer 102 is therefore capable of screening out undesirable noise yet maintains its high sensitivity to weak signals. The transducer 102 as fabricated can interact with storage media having narrow data tracks which emanate weaker magnetic flux, and in noisy environments.

Figure 10:
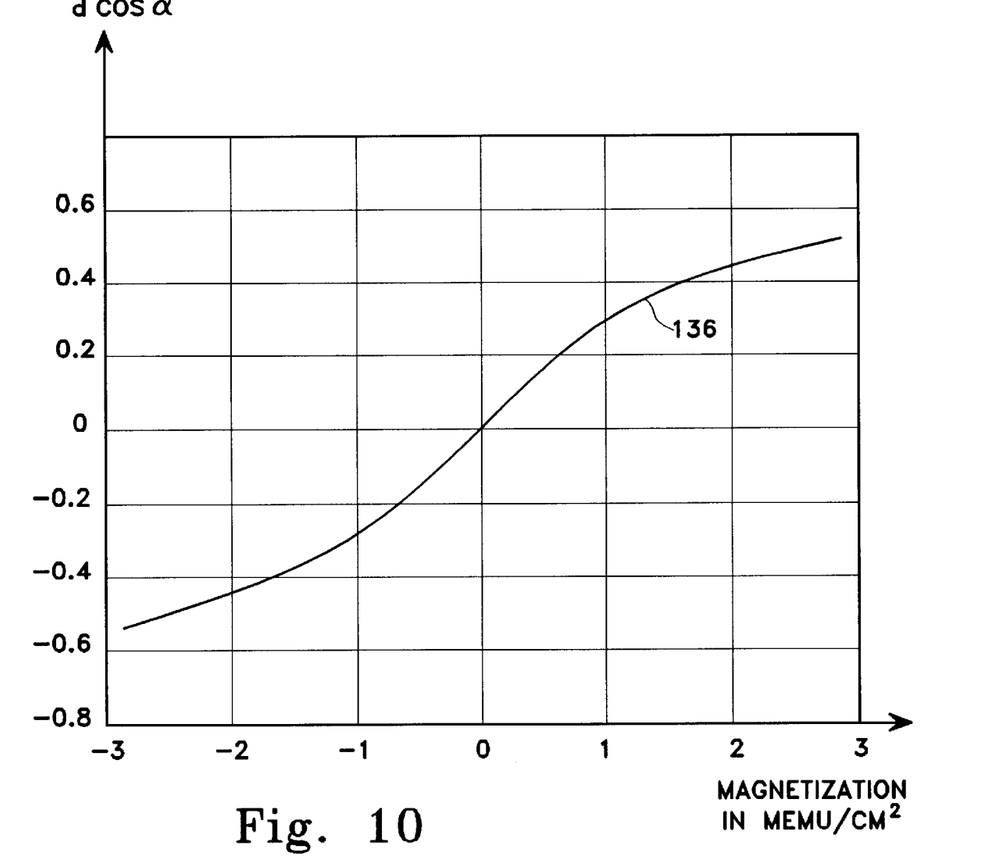
FIG. 10 is a graphical representation showing the substantially linear relationship between the output signal and the flux sensed by the giant MR transducer as shown in FIG. 6.

In addition to the above, signals generated by the transducer 102 is relatively symmetrical, due to the inherent symmetrical design of the transducer 102. Shown in FIG. 10 are the combined output of the two spin valves 106 and 108 represented by the curve 136. The y-axis is the cosine of the magnetization angle α, and the x-axis is the flux emanating from the storage medium.

Figure 11:
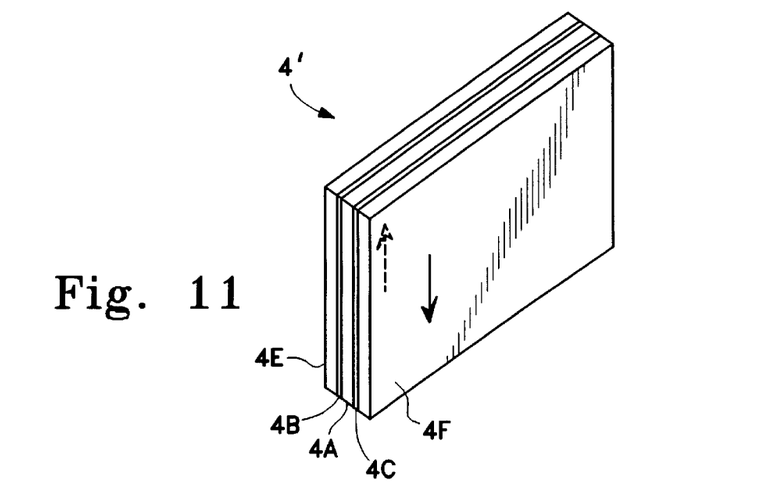
FIG. 11 is an isometric view showing another implementation of the bias layer for the transducers of the invention as shown in FIGS. 1 and 6.

It should be understood that other variations may be made within the scope of the invention. For example, shown in FIG. 11 is another implementation of the bias portion 4' which can be used to replace the bias portion 4 in the previous embodiments. Bias portion 4' is a composite layer including an insulating sublayer 4A sandwiched between two electrically conducting sublayers 4B and 4C. Deposited in contact with each of the layers 4B and 4C are antiferromagnetic sublayers 4E and 4F, respectively. The insulating sublayer 4A can be made of an electrically insulating and nonmagnetic material, such as alumina ($Al_2O_3$). Conducting sublayers 4B and 4C are made from electrically conducting but nonmagnetic materials. Examples of materials suitable for the sublayers 4B and 4C are copper, gold and silver. The sublayers 4E and 4F can be built of antiferromagnetic material such as ferrous manganese (FeMn). To suit the applications for the various embodiments, directions of magnetization on the surfaces of the bias portion 4' can be oriented in any desired directions during fabrication, as disclosed in the referenced copending application. These and other changes in form and detail may be made therein without departing from the scope and spirit of the invention as defined by the appended claims.

What is claimed is:

1. A magnetoresistive transducer for providing assertive and complementary signals, comprising:

a common bias layer of an antiferromagnetic material, said layer having a first surface magnetized in a first direction, and a second surface magnetized in a second direction wherein said common layer is an exchange biased means for use in an anisotropic magnetoresistive head;

an assertive transducer portion having a first layer of ferromagnetic material disposed in contact with said first surface, said first layer of ferromagnetic material being magnetically biased by said common antiferromagnetic layer substantially along said first direction; and a complementary transducer portion having a second layer of ferromagnetic material disposed in contact with said second surface, said second layer of ferromagnetic material being magnetically biased by said common antiferromagnetic layer substantially along said second direction;

said common bias layer providing both longitudinal and transverse magnetic biases to said assertive and complementary transducer portions;

including a current source connected to said first and second layers of ferromagnetic material for providing current to generate magnetic fields so that the uniaxial anisotropy in said first and second ferromagnetic layers can be rotated concurrently to different non-parallel directions respectively;

a first conductive lead connected between said current source and said ferromagnetic layer of said assertive portion; and a second conductive lead connected between said current source and said ferromagnetic layer of said complementary portion.

2. A magnetoresistive transducer as set forth in claim 1 wherein said common layer is an exchange pinned means for use in a spin valve or giant magnetoresistive sensor.

3. A magnetoresistive transducer as set forth in claim 1 further including an amplifier having first and second inputs coupled to said first and second layers of ferromagnetic material, respectively.

4. A magnetoresitive transducer as set forth in claim 1 wherein said antiferromagnetic material is electrically insulating.

5. A magnetoresistive transducer as set forth in claim 4 wherein said antiferromagnetic material comprises an oxide of an alloy including nickel and cobalt.

6. A magnetoresistive transducer as set forth in claim 1 including amplifier means having first and second outputs coupled to said assertive and complementary transducer portions respectively.

7. A thin film magnetoresistive transducer for converting changes in magnetic flux sensed from a recording medium to an electrical signal in assertive and complementary versions, comprising:

a bias layer formed of antiferromagnetic material, said bias layer having a first surface magnetized in a first direction, and a second surface magnetized in a second direction;

a first layer of ferromagnetic material disposed in contact with said first surface, said first layer being magnetically biased by said bias layer substantially along said first magnetization direction;

a second layer of ferromagnetic material disposed in contact with said second surface, said second layer being magnetically biased by said bias layer substantially along said second direction;

a current source;

a first conductor connected between said current source and said first layer of ferromagnetic material; and a second conductor connected between said current source and said second layer of ferromagnetic material;

wherein each of said layers of ferromagnetic material are biased differently by said bias layer in different directions, and varies in resistivity differently in response to changes in magnetic flux intercepted by said transducer, such that when an electrical current passes through said first layer of ferromagnetic material, said first layer correspondingly generates a varying voltage as an assertive version of the electrical signal, and such that when another electrical current passes through said second layer of ferromagnetic material simultaneously with the electrical current that passes through said first layer of ferromagnetic material, said second layer correspondingly generates another varying voltage as a complementary version of the electrical signal wherein said different directions of said differently biased first and second layers of ferromagnetic material are not parallel.

8. A magnetoresistive transducer as set forth in claim 7 wherein said bias layer of antiferromagnetic material comprises an oxide of an alloy including nickel and cobalt.

9. A magnetoresistive transducer as set forth in claim 7 wherein said first and second layers of ferromagnetic material comprise a nickel-iron alloy, and said bias layer of antiferromagnetic material comprises an oxide of an alloy including nickel and cobalt.

* * * * *